US011041744B2

(12) United States Patent
Seo et al.

(10) Patent No.: US 11,041,744 B2
(45) Date of Patent: Jun. 22, 2021

(54) COMPOSITE SENSOR PACKAGE

(71) Applicant: LG INNOTEK CO., LTD., Seoul (KR)

(72) Inventors: Jeong Gi Seo, Seoul (KR); Ki Chul Chang, Seoul (KR); Sun Hwa Lee, Seoul (KR); Jun Young Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 352 days.

(21) Appl. No.: 16/089,499

(22) PCT Filed: Mar. 30, 2017

(86) PCT No.: PCT/KR2017/003525
§ 371 (c)(1),
(2) Date: Sep. 28, 2018

(87) PCT Pub. No.: WO2017/171455
PCT Pub. Date: Oct. 5, 2017

(65) Prior Publication Data
US 2020/0300676 A1 Sep. 24, 2020

(30) Foreign Application Priority Data
Mar. 31, 2016 (KR) .................. 10-2016-0039740

(51) Int. Cl.
G01D 21/02 (2006.01)
B81B 3/00 (2006.01)
(52) U.S. Cl.
CPC ........... G01D 21/02 (2013.01); B81B 3/0027 (2013.01)

(58) Field of Classification Search
CPC ....... B81B 3/0027; B81B 7/00; G01D 11/245; G01D 21/02; H01L 23/02; G01H 11/08; H04R 17/02
See application file for complete search history.

(56) References Cited

U.S. PATENT DOCUMENTS

2013/0136291 A1 5/2013 Lee et al.
2015/0146888 A1 5/2015 Kim
(Continued)

FOREIGN PATENT DOCUMENTS

JP 2002-328117 A 11/2002
JP 2012-127759 A 7/2012
(Continued)

OTHER PUBLICATIONS

Machine translation of JP-2012127759 A.*
(Continued)

Primary Examiner — Francis C Gray
(74) Attorney, Agent, or Firm — LRK Patent Law Firm

(57) ABSTRACT

A composite sensor package includes: a substrate; a first sensor and a second sensor, which are arranged on the substrate with a predetermined gap therebetween; a signal processing device disposed on the substrate and processing a signal transmitted through the first and second sensors; and a cover disposed on the substrate, and including a package accommodation space enclosing the first sensor, the second sensor and the signal processing device, wherein the first sensor senses a state of air introduced from an outside and transmits the introduced air to the package accommodation space, and the second sensor senses the state of the air, which passes through the first sensor so as to flow into the package accommodation space.

20 Claims, 8 Drawing Sheets

(56) References Cited

U.S. PATENT DOCUMENTS

| | | | |
|---|---|---|---|
| 2015/0256913 A1 | 9/2015 | Dehe | |
| 2017/0369305 A1* | 12/2017 | Suvanto | B81B 7/008 |
| 2018/0148323 A1* | 5/2018 | Ghidoni | G01J 1/429 |
| 2018/0317022 A1* | 11/2018 | Evans | H04R 17/00 |
| 2020/0092658 A1* | 3/2020 | Zou | H04R 19/005 |
| 2020/0139368 A1* | 5/2020 | Mou | F16K 99/0051 |

FOREIGN PATENT DOCUMENTS

| | | |
|---|---|---|
| JP | 2012127759 A * | 7/2012 |
| KR | 20-0245381 Y1 | 10/2001 |
| KR | 10-2011-0137900 A | 12/2011 |
| KR | 10-2013-0060932 A | 6/2013 |
| KR | 10-2015-0060469 A | 6/2015 |
| KR | 10-2015-0105232 A | 9/2015 |

OTHER PUBLICATIONS

Search Report, dated Jul. 25, 2017, for International Application No. PCT/KR2017/003525.
Written Opinion, dated Jul. 25, 2017, for International Application No. PCT/KR2017/003525.

* cited by examiner

COMPOSITE SENSOR PACKAGE

CROSS-REFERENCE TO RELATED APPLICATIONS

The present application is a U.S. National Phase entry from International Application No. PCT/KR2017/003525, filed Mar. 30, 2017, which claims priority to Korean Patent Application No. 10-2016-0039740, filed Mar. 31, 2016, the disclosure of which is incorporated by reference herein in its entirety.

BACKGROUND

1. Technical Field

The present invention relates to a composite sensor package, and more particularly, to a composite sensor package in which an environmental sensor is additionally provided in a microphone for voice recognition, thereby enabling recognition of an environmental condition together with voice recognition operation of the microphone.

2. Description of Related Art

In general, acoustic devices generate sound by vibrating a diaphragm using electrodes, and according to recent technology development, a great progress has been made in the field of acoustic devices.

Such acoustic devices are being used in various fields such as portable terminals, hearing aids, and the like, and size of the acoustic device itself has been downsized according to slimming of apparatuses to which the audio device is applied.

In addition, recently, microphones using micro electro mechanical systems (MEMS) of semiconductor technology have been developed and used. MEMS is a technology that enables the fabrication of small mechanical components on a surface of a silicon wafer. Such MEMS microphones may be classified into an electrostatic type and a piezoelectric type, and include a general condenser type.

Meanwhile, as conditions that a gas sensor should have, it is required to have characteristics such as quickness showing how quickly it can react, sensitivity showing how much a minute amount can be detected, durability showing how long it can be operated, and economic efficiency showing how much affordably consumers can use a sensor.

In addition, in order to combine with a conventional semiconductor process technology, it is necessary to have characteristics that are easy to integrate and arrange. As a practical gas sensor, household gas leak alarms made of tin oxide ($SnO_2$) as a material are widely used. In the operation principle, there is a semiconductor type using a change in resistance value according to a change in amount of gas, and an oscillator type using a change in frequency when a gas is adsorbed to an oscillator oscillating with a certain frequency. Most gas sensors use a semiconductor type which has a simple circuit and exhibits stable thermal characteristics at room temperature.

Meanwhile, in the case of a conventional microphone sensor, only a function of recognizing a voice is performed by being configured independently of the gas sensor and inputting the voice. At this point, the microphone sensor has an air passage hole formed on a substrate so that it can be connected to the outside to allow air to pass therethrough.

In addition, a conventional gas sensor is configured independently of the microphone sensor and performs gas detection with respect to an input signal.

However, in the case of the above-described microphone or gas sensor, when the microphone and the gas sensor are separately formed on the respective substrates independently of each other, and accordingly, when the microphone and the gas sensor are respectively configured in a device such as a mobile terminal, there is a problem in that package cost is increased due to increasing of a mounting area.

SUMMARY

According to an embodiment of the present invention, there is provided a composite sensor package in which a microphone sensor and an environmental sensor may be configured as one integrated package.

In addition, in an embodiment according to the present invention, there is provided a composite sensor package having the same signal as an input signal of a microphone sensor so that a sensing operation is performed by an environmental sensor.

Technical problems to be solved by the embodiments proposed herein are not limited to those mentioned above, and other unmentioned technical aspects should be clearly understood by one of ordinary skill in the art to which the embodiments proposed herein pertain from the description below.

A composite sensor package according to an embodiment includes: a substrate; a first sensor and a second sensor disposed on the substrate at a predetermined distance therebetween; a signal processing device disposed on the substrate and processing a signal transmitted via the first and second sensors; and a cover disposed on the substrate and including a package accommodation space surrounding the first sensor, the second sensor and the signal processing device, wherein the second sensor senses a state of air passing the first sensor and introduced into the package accommodation space.

In addition, the substrate includes a through hole formed at a region in which the first sensor is disposed and transmitting a sound wave to the first sensor.

Further, the first sensor detects a sound wave introduced through the through hole, and passes through air that has transmitted the introduced sound wave and transmits the air to the package accommodation space.

Furthermore, the first sensor is a microphone sensor, and the second sensor includes at least one of a temperature sensor, a humidity sensor, a pressure sensor, and a gas sensor for sensing a state of the air that has transmitted the sound wave.

In addition, the first sensor includes a sensor body disposed on the substrate and having a hollow portion formed at a region corresponding to the through hole, a vibrating membrane covering the hollow portion and disposed on the sensor body and having a first air passage hole formed therein, and a back plate supported by the sensor body and disposed on the vibrating membrane and having a second air passage hole formed therein.

Further, the first sensor outputs a signal corresponding to a change in the distance between the vibrating membrane and the back plate due to vibration generated by the sound wave, and transmits the air that has transmitted the sound wave through the first air passage hole and the second air passage hole to the package accommodation space.

In addition, the first sensor includes a sensor body disposed on the substrate and having a hollow portion formed at a region corresponding to the through hole, a back plate covering the hollow portion and disposed on the sensor body and having an air passage hole formed therein, and a membrane supported by a spring by the sensor body and disposed on the back plate.

Further, the back plate is disposed on an upper portion and a lower portion of the membrane, respectively, with the membrane therebetween.

Furthermore, the first sensor outputs a signal corresponding a change in the distance between the vibrating membrane and the back plate due to vibration generated by the sound wave, and transmits the air that has transmitted the sound wave through the air passage hole and the spring to the package accommodation space.

In addition, the first sensor includes a sensor body disposed on the substrate and having a hollow portion formed at a region corresponding to the through hole, a first metal layer disposed on the sensor body and including molybdenum, and a second metal layer disposed between the plurality of first metal layers and including aluminum nitride, and an air passage hole is formed at the first metal layer and the second metal layer to pass the air that has transmitted the sound wave.

Further, the first sensor includes a sensor body disposed on the substrate and having a hollow portion formed at a region corresponding to the through hole, a back plate disposed on the sensor body, and a vibrating membrane disposed on the back plate, with a spacer therebetween, and an air passage hole is formed at a lower portion of the sensor body to transmit the air that has transmitted the sound wave to the package accommodation space.

In addition, the second sensor includes a body disposed on the substrate, and a sensing part disposed on a surface of the body and detecting a state of the air passing the first sensor and diffused into the package accommodation space.

Meanwhile, a composite sensor package according to another embodiment includes: a substrate; a case covering an upper region of the substrate and including a first accommodation space therein; a first sensor disposed in the first accommodation space on the substrate and including a second accommodation space therein; and a second sensor disposed in an accommodating space of the first sensor, wherein the second sensor is disposed in the first sensor and senses a state of air passing the first sensor and introduced into the second accommodation space.

In addition, the case includes a through hole formed at a region in which the first sensor is disposed and transmitting a sound wave to the first sensor.

In addition, the first sensor detects a sound wave introduced through the through hole, and passes air that has transmitted the introduced sound wave and transmits the air to the second accommodation space therein.

In addition, the first sensor is a microphone sensor, and the second sensor includes at least one of a temperature sensor, a humidity sensor, a pressure sensor, and a gas sensor for sensing a state of the air that has transmitted the sound wave.

In addition, the composite sensor package further includes a signal processing device, which is disposed in the second accommodation space for processing output signals of the first sensor and the second sensor.

In addition, the composite sensor package further includes a signal input/output pad, which is disposed on a lower surface of the substrate and electrically connected to the signal processing device.

In addition, the first sensor includes a diaphragm vibrated by a sound wave transmitted through the through hole to generate a change in electric field, a back electrode plate disposed under the diaphragm and in which stored electric charges change due to a change in vibration transmitted from the diaphragm, and a connection part disposed between the back electrode plate and the substrate and spacing apart between the back electrode plate and the substrate to form the second accommodating space.

In addition, a first air passage hole is formed at the first diaphragm, a second air passage hole is formed at the second diaphragm, and the air that has transmitted the sound wave through the first and second air passage holes is transmitted into the second accommodation space.

Advantageous Effects

According to an embodiment of the present invention, an integrated package is configured by integrating a microphone sensor and an environmental sensor having the same requirement for a configuration of a package, thereby improving performance while reducing a size or cost of a sensor.

In addition, according to an embodiment of the present invention, by forming only one inlet hole through which external air may flow into a composite sensor package, it is possible to reduce malfunction of a sensor due to the introducing of dust, moisture or the like, which is generated as the inlet hole increases.

Further, according to an embodiment of the present invention, as voice recognition is performed via the microphone sensor by configuring a microphone sensor and a gas sensor as an integrated package, it is possible to easily check health information of a user who has performed the voice recognition.

Further, according to an embodiment of the present invention, by allowing the same air to flow into a microphone sensor and a gas sensor, it is possible to make a voice signal (air) of only a user used in the voice recognition flow into the gas sensor, so that a more accurate check of health condition can be performed, thereby improving user satisfaction.

DETAILED DESCRIPTION OF THE INVENTION

Figure 1:
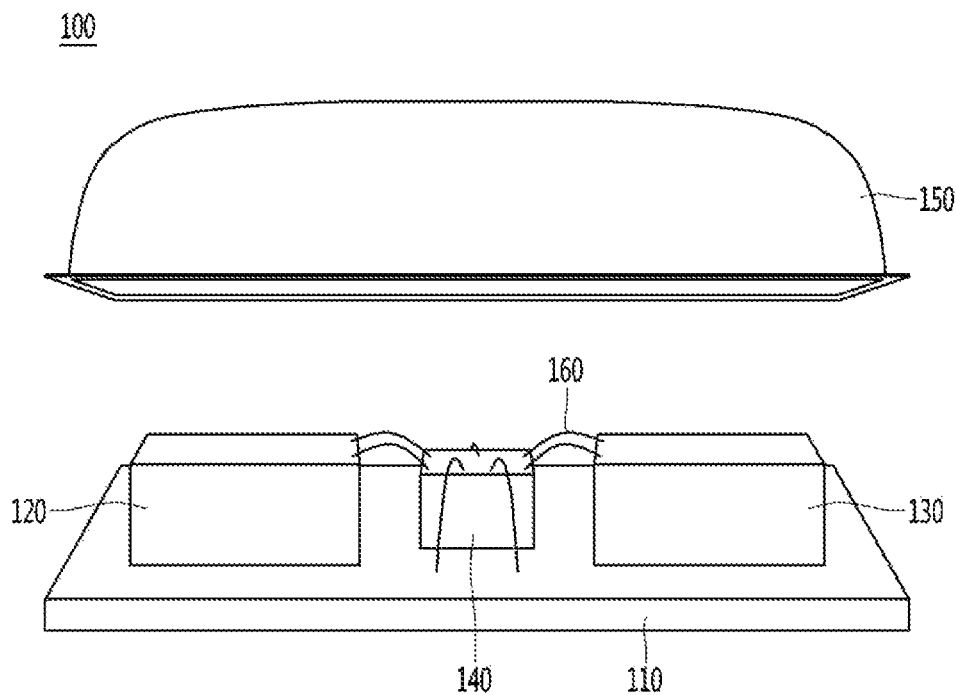
FIG. 1 is a view illustrating a schematic configuration of a composite sensor package according to a first embodiment of the present invention.

Advantages, features, and methods of achieving the same of the present disclosure will become clear upon referring to embodiments described below in detail with reference to the accompanying drawings. However, the present disclosure is not limited to the embodiments disclosed below and may be implemented in various other forms. The embodiments are merely provided to make the disclosure of the present disclosure complete and completely inform one of ordinary skill in the art to which the present disclosure pertains of the scope of the present disclosure. The present disclosure is defined only by the scope of the claims below. Like reference numerals refer to like elements throughout.

In describing embodiments of the present disclosure, when detailed description of a known function or configuration is deemed to unnecessarily blur the gist of the present disclosure, the detailed description will be omitted. Terms described below are terms defined in consideration of functions in the embodiments of the present disclosure and may vary depending on the intention of a user or operator or a practice. Therefore, such terms should be defined on the basis of the entire contents disclosed herein.

Hereinafter, embodiments will be shown more apparent through the description of the appended drawings and embodiments. In the description of the embodiment, when it is described that each layer (film), region, pattern, or structure is formed "above/on" or "below/under" a substrate, each layer (film), region, pad or pattern, the description includes being formed both "directly" or "indirectly (by interposing another layer)" "above/on" or "below/under". Also, a thickness or size of each layer in the drawings is exaggerated, omitted, or schematically illustrated for convenience of explanation or clarity. In addition, the size of each component does not totally reflect its actual size. Hereinafter, the embodiments will be described with reference to the drawings.

[Package Structure According to a First Embodiment]

A typical micro-electro mechanical system (MEMS) microphone is classified into an electrostatic type, piezoelectric type and condenser type.

The electrostatic type microphone uses the principle in which a resistance value changes by vibration, the piezoelectric type microphone uses a piezo effect in which a potential difference is generated at both ends of a diaphragm, and the condenser type microphone has a structure in which one metal plate of two metal plates is a back plate, and has an air gap of several to several tens of μm between two electrodes so that the other diaphragm may vibrate in response to an acoustic signal.

In the present invention, regardless of the type of the microphones, a microphone sensor and an environmental sensor are composed into one integrated package so that voice recognition is performed via the microphone sensor, and simultaneously, an environmental condition is sensed via the environmental sensor.

Here, the environmental sensor may include a gas sensor, a pressure sensor, a humidity sensor, and the like. Hereinafter, for convenience of explanation, it is explained that the environmental sensor is constituted with a gas sensor. However, this is only an embodiment of the present invention, and it will be obvious to a person skilled in the art that the sensor constituted together with the microphone sensor may be constituted with a pressure sensor or a humidity sensor other than the gas sensor.

Figure 2:
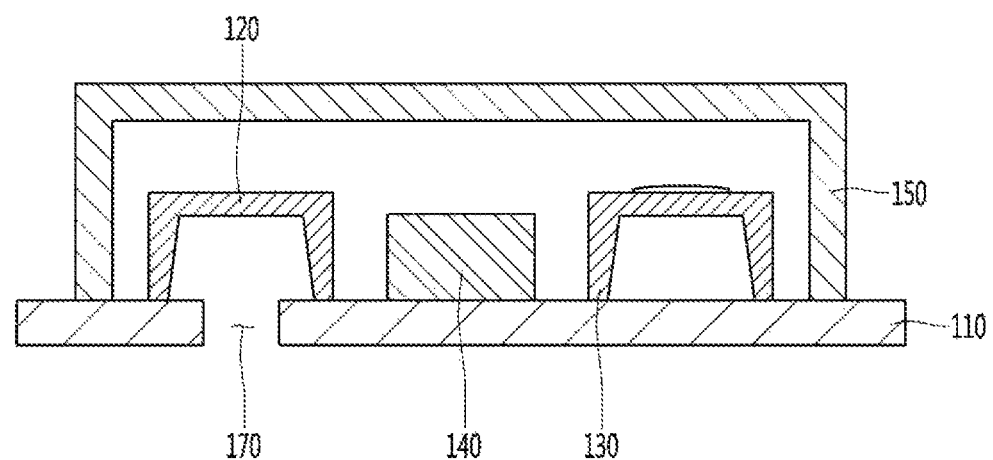
FIG. 2 is a cross-sectional view of the composite sensor package according to the first embodiment of the present invention.

FIG. 1 is a view illustrating a schematic configuration of a composite sensor package according to a first embodiment of the present invention, and FIG. 2 is a cross-sectional view of the composite sensor package according to the first embodiment of the present invention.

Referring to FIGS. 1 and 2, a composite sensor package 100 includes a substrate 110, a first sensor 120, a second sensor 130, a signal processing device 140, a cover 150, and a connection member 160.

The substrate 110 is a support substrate of a composite sensor in which a circuit pattern is formed. At this point, the substrate 110 may refer to an insulating layer region in which any one circuit pattern of the substrate having a plurality of stacked structures is formed.

The substrate 110 forms an insulating plate, may be a thermosetting or thermoplastic polymer substrate, a ceramic substrate, an organic-inorganic composite material substrate, or a glass fiber-impregnated substrate. The substrate 110 may include an epoxy-based insulating resin such as FR-4, bismaleimide triazine (BT) and Ajinomoto build-up film (ABF) when including a polymer resin, or also include a polyimide-based resin unlike the above, but is not particularly limited thereto.

Preferably, the substrate 110 may be a substrate having high heat dissipation characteristics. For this, at least one additive may be added to a ceramic resin of a ceramic material in the substrate 110.

Here, the additive to be added to the ceramic resin is preferably a nitride filler. The nitride filler to be added to the ceramic resin may include at least one of BN, AlN, $Al_2O_3$, and MgO.

That is, in the case of a substrate of general FR4 material, thermal conductivity is as low as 0.5 W/mK, and accordingly heat generated in a device may not be smoothly discharged to an outside and the temperature gradient between a hot junction and a cold junction of a sensor constituting the device may be unstable and temperature accuracy may be low.

In addition, in the case of a ceramic substrate, the thermal conductivity indicates high temperature accuracy at the level of 20 W/mK, but the price is high.

Therefore, in the present invention, the nitride filler is added to the ceramic resin as described above to have thermal conductivity of 20 W/mK similar to that of the ceramic substrate, and the plurality of devices are mounted by using a new heat dissipation substrate which is cheaper than the ceramic substrate.

At least one circuit pattern (not shown) is formed at least one of an upper surface and a lower surface of the substrate 110. The circuit pattern is connected to the first sensor 120, the second sensor 130, and the signal processing device 140 via the connection member 160, respectively.

The circuit pattern may be formed by a general process of manufacturing a printed circuit board (PCB), such as an additive process, a subtractive process, a modified semi additive process (MSAP), a semi additive process (SAP), etc., and detailed descriptions thereof will be omitted herein.

Meanwhile, the circuit pattern may include a plurality of patterns disposed to be spaced apart on the substrate 110 at a predetermined distance.

The circuit pattern may include at least one of a surface treatment plated layer of, silver, gold, and tin to copper.

A via (not shown) may be additionally formed at the substrate 110. The via may electrically connect circuit patterns formed on different surfaces of the substrate 110 to each other.

For example, the circuit pattern may be further formed at the lower surface of the substrate 110, and the circuit pattern formed at the lower surface may be electrically connected to the circuit pattern formed at the upper surface of the substrate 110 through the via. Therefore, the circuit pattern formed at the lower surface of the substrate 110 may be used as an output pad for transmitting output signals from the first sensor 120, the second sensor 130, and the signal processing device 140 to the outside, and may be used as an input pad for transmitting a input signal from the outside to the first sensor 120, the second sensor 130, and the signal processing device 140.

Meanwhile, the substrate 110 may be made of a silicon substrate, and a through hole 160 is formed at a specific position. The through hole 160 may be an air inlet for introducing air, and a sound that has been transmitted from a specific user through the air inlet is introduced into the package through the through hole 160 of the substrate 110.

The first sensor 120, the second sensor 130, and the signal processing device 140 are disposed on the substrate 110 at a predetermined distance.

At this point, the signal processing device 140 may be disposed between the first sensor 120 and the second sensor 130 so that a sensing signal obtained via the first sensor 120 and the second sensor 130 may be received and processed, respectively.

When the signal processing device 140 is disposed between the first sensor 120 and the second sensor 130, electrical connection between the first sensor 120 and the second sensor 130 is easier so that the electrical connection may be made even with a shorter pattern, and thus electrical reliability can be further improved.

The first sensor 120 is a microphone sensor that converts a voice into an electrical signal. The first sensor 120 converts the voice into an electrical signal by at least one of an electrostatic method, a piezoelectric method, and a condenser method.

The first sensor 120 is disposed at a position in which the through hole 160 is formed, of the upper surface of the substrate 110. In particular, the first sensor 120 receives a sound wave through the through hole 160, and vibration is generated by the received sound wave to recognize the voice.

At this point, the first sensor 120 has a membrane structure, so that the first sensor 120 includes a hollow portion of the membrane structure. In addition, the hollow portion of the first sensor 120 is disposed at a position extending vertically to the through hole 160 in order to receive a sound wave introduced through the through hole 160.

In other words, the hollow portion formed at a lower center of the first sensor 120 is disposed on the upper surface of the substrate 110 that extends vertically from the through hole 160. Therefore, the first sensor 120 may receive a sound wave included in air introduced from the through hole 160 without loss, and output an electric signal corresponding to a change in vibration due to the input sound wave.

The first sensor 120 receives the sound wave introduced through the through hole 160 and simultaneously, diffuses the air that has transmitted the sound wave into a package body.

In other words, the first sensor 120 receives the sound wave into a sensor accommodation space to recognize the voice and simultaneously, passes the air that has transmitted the sound wave into a package accommodation space surrounding the first sensor 120, the second sensor 130 and the signal processing device 140.

In other words, when a voice is output from the user, the sound wave corresponding to the voice is carried in the air and introduced into the through hole 160, and the sound wave introduced into the through hole 160 vibrates the first sensor 120.

In addition, the first sensor 120 recognizes and outputs a voice according to the generated vibration. At this point, the first sensor 120 pass the air that has transmitted the sound wave into the package accommodation space, so that specific state information by the air that has passed is detected via the second sensor 130.

At this point, the first sensor 120 may be implemented by any one of the electrostatic method, the piezoelectric method, and the condenser method as described above, and a passing path of the air is changed according to the implementation method.

That is, when the first sensor 120 is an electrostatic type or a piezoelectric type, an air hole (to be described later) may be formed at a layer for detecting the sound wave, and the air may be moved into the package accommodation space in the first sensor 120 through the air hole. Therefore, when the first sensor 120 is implemented by an electrostatic method or a piezoelectric method, the air may be passed without changing a structure of a conventional microphone sensor.

However, when the first sensor 120 is implemented by a condenser method, in the condenser method, the air hole may not be formed in at least one of the layers for detecting the sound wave, and the air may not be introduced into the package accommodation space via the first sensor 120 due to the layer in which the air hole is not formed.

In this case, according to the present invention, an air passage hole is formed to pass the air in a specific region of the first sensor 120 within a range not causing loss of the sound wave, so that the air passes the first sensor 120 through the formed air passage hole so as to be introduced into the package accommodation space.

The second sensor 130 is disposed at a region, which is spaced apart from the first sensor 120 of the upper surface of the substrate 110 at a predetermined distance.

The second sensor 130 senses the air introduced into the package accommodation space and outputs a sensing signal corresponding thereto.

The second sensor 130 may include at least one of a temperature sensor, a pressure sensor, a moisture sensor, and a gas sensor.

In other words, the second sensor 130 may be a pressure sensor that detects a pressure of the air that has passed the first sensor 120. Alternatively, the second sensor 130 may be a temperature sensor that detects a temperature of the air that has passed the first sensor 120. Alternatively, the second sensor 130 may be a moisture sensor that detects moisture included in the air that has passed the first sensor 120. Alternatively, the second sensor 130 may be a gas sensor that detects a gas included in the air that has passed the first sensor 120.

In this case, the second sensor 130 may be a health information acquisition sensor for checking a health state of a user who generates an input signal to the first sensor 120.

That is, the user generates a voice into the through hole 160 of the composite sensor package. At this point, the first sensor 120 detects a sound wave corresponding to the voice of the user introduced into the through hole 160. At this point, in the air that has transmitted the sound wave, pressure, humidity, temperature, gas concentration, and the like change depending on the health state of the user who generates the sound wave.

In other words, for example, when a health condition of the user is abnormal, a specific gas is included in the air that has transmitted the sound wave.

That is, when the user has diabetic symptoms, an acetone gas may be included in the air that has transmitted the sound wave. In addition, when the user has a lung cancer symptom, a toluene gas may be included in the air that has transmitted the sound wave. Further, when the user has a kidney disease, an ammonia gas may be included in the air that has transmitted the sound wave. Furthermore, when the user has a liver disease, an amine gas may be included in the air that has transmitted the sound wave.

Accordingly, the second sensor 130 detects at least one of the pressure, gas, temperature, and humidity of the air that has transmitted the sound wave, and outputs the detected state signal.

In other words, the first sensor 120 and the second sensor 130 according to the present invention operate in combination with each other, and thus, this means that an operation of the second sensor 130 is performed in cooperation with an operation of the first sensor 120. In other words, when a voice is generated from the user, the first sensor 120 detects a sound wave corresponding to the voice of the user, and the second sensor 130 detects a state of the air that has transmitted the sound wave.

Meanwhile, the first sensor 120 and the second sensor 130 may operate independently without cooperating with each other. In other words, the second sensor 130 can detect the gas state, the humidity state, the temperature state, the pressure state, and the like for the space in which the composite sensor package is installed, in a state in which no user voice is generated.

However, preferably, the second sensor 130 is operated together with the first sensor 120 so that the first sensor 120 may detect a health condition of the user who generates the sound wave.

A signal processing device 140 is disposed to be spaced apart from the first sensor 120 and the second sensor 130 at a predetermined distance on the substrate 110. The signal processing device 140 receives a sensing signal of the first sensor 120 and a sensing signal of the second sensor 130, respectively, and processes the received sensing signal.

At this point, the signal processing device 140 is preferably disposed between the first sensor 120 and the second sensor 130 for ease of connection of a signal line.

Meanwhile, in the present invention, only one signal processing device 140 is disposed on the substrate 110, but this is only an embodiment, and a first signal processing device for processing a sensing signal of the first sensor 120 and a second signal processing device for processing a sensing signal of the second sensor 130 may be disposed on the substrate 110, respectively.

The signal processing device 140 is a device connected to the first sensor 120 and the second sensor 130 to process an electrical signal, so that the signal processing device 140 may be an application specific integrated circuit (ASIC).

At this point, the signal processing device 140 may include a voltage pump (not shown) for providing a voltage to the first sensor 120 and a buffer (not shown) for amplifying or impedance-matching an electrical acoustic signal sensed via the first sensor 120 to output to the outside. Here, the voltage pump may be implemented as a DC-DC converter, and the buffer may be implemented as an analog-to-digital converter (ADC).

A cover 150 is disposed on the substrate 110 to surround the first sensor 120, the second sensor 130 and the signal processing device 140 mounted on the substrate 110.

In particular, the cover 150 may be configured with a rectangular barrel, a cylinder, an elliptical barrel, and a polygonal barrel, having a connection surface opened with the substrate 110 to mount the first sensor 120, the second sensor 130, and the signal processing device 140 thereon.

The cover 150 may be formed of a metal material such as brass or copper, stainless steel, aluminum, or a nickel alloy, and may be used by plating gold or silver. In addition, the cover 150 may have various shapes such as a circular shape or a square shape, or a shape in which a wing protrudes at an end portion of the cover.

Meanwhile, the cover 150 may be fixed on the substrate 110 by a provisional welding. At this point, the provisional welding may be performed by a laser. However, this is only an embodiment, and the cover 150 may be fixed on the substrate 110 by a method such as soldering or punching, and alternatively, the cover 150 may be fixed on the substrate 110 by an adhesive such as conductive or non-conductive epoxy, silver paste, silicone, urethane, acrylic and cream solder or the like.

As described above, according to an embodiment of the present invention, since an integrated package may be configured by integrating a microphone sensor and an environmental sensor having the same requirement for the package configuration, it is possible to improve performance while reducing the size or cost of a sensor.

In addition, according to an embodiment of the present invention, since only one inlet hole capable of introducing the outside air into the composite sensor package may be formed, it is possible to reduce sensor malfunction due to the introduction of dust, moisture, or the like, which is generated as the inlet hole increases.

Moreover, according to an embodiment of the present invention, since the microphone sensor and the gas sensor are integrated into one package, the health information of a user who has performed a voice recognition may be easily checked as the voice recognition is performed through the microphone sensor.

Further, according to an embodiment of the present invention, since the same air is introduced into the microphone and the gas sensor, only the user's voice signal (air) used for the voice recognition may be introduced into the gas sensor, so that a more accurate health status check may be performed, and thus the user satisfaction can be improved.

Hereinafter, the structure of the first sensor 120 capable of passing the air that has transmitted the sound wave to transmit into the package accommodation space while detecting the sound wave will be described in more detail.

First, the first sensor 120 may be fabricated by using MEMS technology, and may operate in any one of electro-static, piezoelectric, and condenser methods.

FIGS. 3 to 6 are diagrams illustrating various embodiments of the first sensor 120 shown in FIG. 1.

Figure 3:
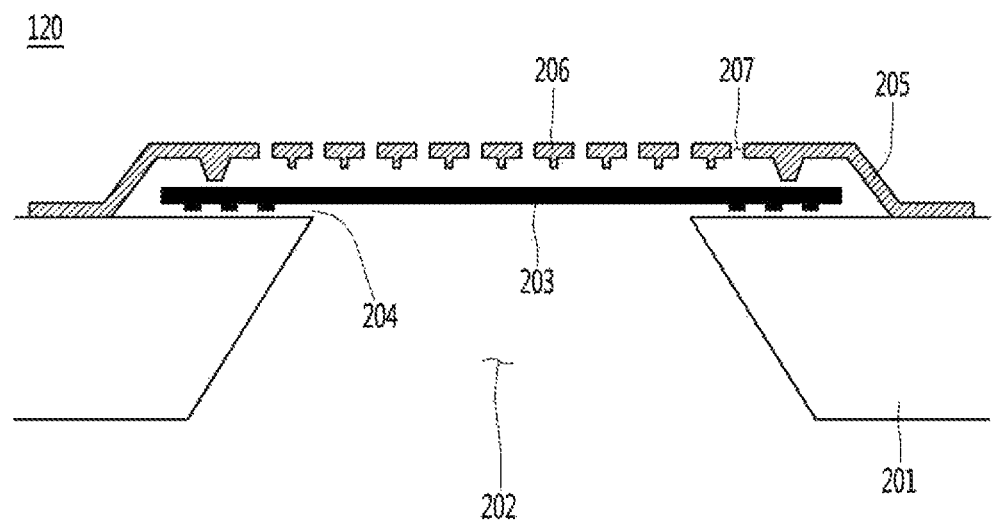
FIGS. 3 to 6 are views illustrating various embodiments of a first sensor 120 shown in FIG. 1.

First, referring to FIG. 3, the first sensor 120 includes a sensor body 201 including a hollow portion 202, a vibrating membrane 203 including a first air inlet hole 204, a back plate 206 including a second air inlet hole 207, and a support part 205 for supporting the back plate 206 while fixing the back plate 206 to the sensor body 201.

The first sensor 120 may form an insulating layer on an upper side of the sensor body 201 of a single crystal silicon by using a silicon bulk micromachining and accordingly, the hollow portion 202 and the vibrating membrane 203 may be implemented by operating by anisotropic wet etching or dry etching. In addition, when the hollow portion 202 and the vibrating membrane 203 are formed, the first sensor 120 may be implemented by depositing the back plate 206 supported by the support part 205 using a sacrificial layer according to a silicon surface micromachining.

At this point, a first air inlet hole 204 for air pressure balance between the hollow portion 202 and the package accommodation space may be formed at the vibrating membrane 203, and a second air inlet hole 207 may be formed at the back plate 206.

The vibrating membrane 203 may be disposed to cover the hollow portion 202 of the sensor body 201. Meanwhile, an oxide layer (not shown) may be additionally disposed between the sensor body 201 and the vibrating membrane 203.

A back plate 206 may be disposed on the vibrating membrane 203 and the back plate 206 may be fixed to the sensor body 201 by the support part 205. The back plate 206 may be made of polysilicon or metal.

Meanwhile, an air layer may be formed between the vibrating membrane 203 and the back plate 206 so that the vibrating membrane 203 and the back plate 206 may be spaced apart from each other at a predetermined distance.

The vibrating membrane 203 vibrates according to a sound wave transmitted through the through hole 160 of the substrate 110. That is, when a sound wave is introduced through the through hole 160 of the substrate 110, the sound wave is introduced into the hollow portion 202 of the sensor body 201, so that the flexible vibrating membrane 203 vibrates. At this time, a distance between the vibrating membrane 203 and the back plate 206 changes as the vibrating membrane 203 vibrates by the sound wave from the outside. Accordingly, capacitance between the vibrating membrane 203 and the back plate 206 is changed and such changed capacitance is transmitted to the signal processing device 140 via a pad (not shown) connected to the back plate 206.

The signal processing device 140 converts the transmitted capacitance into an electric signal and outputs the electric signal.

As described above, the first sensor 120 includes a vibrating membrane 203 and a back plate 206 and a hole capable of passing the air is formed at the vibrating membrane 203 and the back plate 206, and accordingly, the capacitance is changed by the sound wave and simultaneously, the air transmitting the sound wave is passed.

Further, the passing air is moved into the cover 150 covering the first sensor 120, that is, into the package accommodation space, and the moved air is transmitted to the second sensor 130.

Meanwhile, the first sensor 120 may have a structure different from that of FIG. 3.

Figure 4:
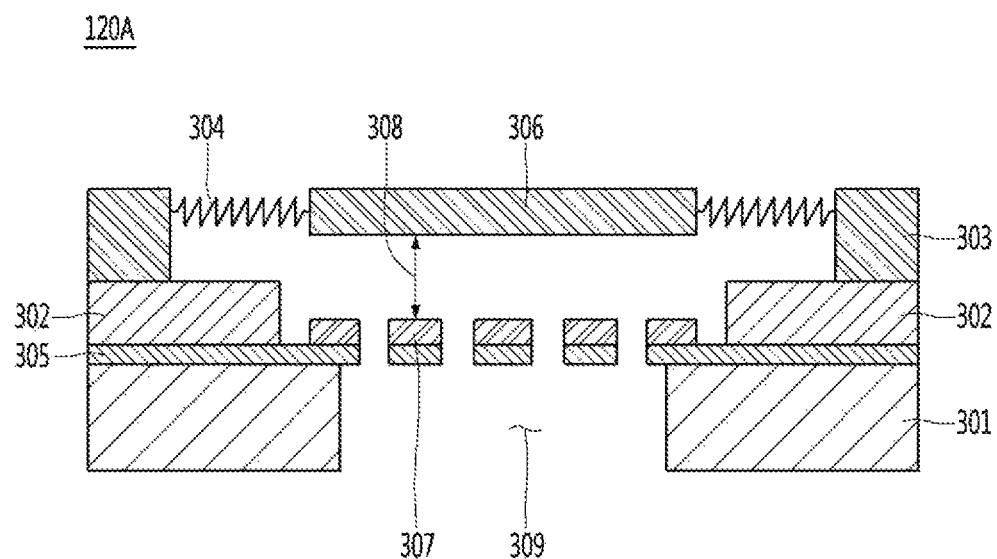

That is, referring to FIG. 4, the first sensor 120 includes a sensor body 301, a membrane support part 303, a first insulating layer 302, a second insulating layer 305, a back plate 307, a membrane 306, and a spring 303.

Referring to FIG. 4, a first insulating layer 302 and a back plate 307 are formed on the sensor body 301, and a second insulating layer 305 is formed to surround the back plate 307.

Furthermore, a membrane 306 is formed to be spaced apart from each other on the back plate 307 at a predetermined distance 308 and a membrane support part 303 is formed to connect the membrane 306 to the sensor body 301.

A spring 304 is provided between the membrane 306 and the membrane support part 303 to provide a buffer function. The spring 304 serves to prevent deformation due to external stress due to packaging.

Reviewing an operation principle of the first sensor 120 shown in FIG. 4, a bias voltage having a predetermined value is applied between the membrane 306 and the back plate 307 to sense a change in capacitance.

In addition, the membrane 306 vibrates in accordance with a sound wave transmitted through the through hole 160 of the substrate 110, so that the membrane 306 is moved toward the back plate 307 or away from the back plate 307, and accordingly, a space between the membrane 306 and the back plate 307 changes. Accordingly, the capacitance between the membrane 306 and the back plate 307 is changed, and such changed capacitance is transmitted to the signal processing device 140.

The signal processing device 140 converts the transmitted capacitance into an electric signal and outputs the electric signal.

As described above, the first sensor 120 is formed with the back plate 307 and the membrane 306 is formed with a hole capable of passing the air (in the case of a membrane, a spring), and accordingly, the capacitance is changed by the sound wave and simultaneously, the air that has transmitted the sound wave is passed.

Further, the passing air is moved into the cover 150 covering the first sensor 120, that is, into the package accommodation space, and the moved air is transmitted to the second sensor 130.

Figure 5:
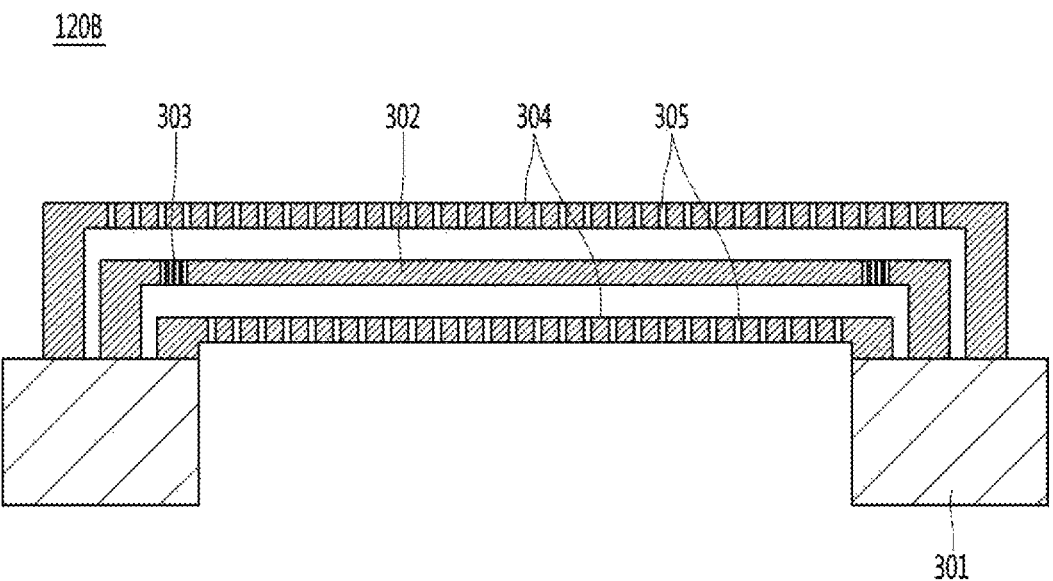

FIG. 5 is a modified example of the first sensor 120 shown in FIG. 4.

Referring to FIG. 5, the first sensor 120 includes a sensor body 301, a plurality of back plates 305 formed with an air inlet hole, and a membrane 302 supported by a spring 303.

As described above, in the first sensor 120, a plurality of back plates 305 may be disposed with the membrane 302 therebetween and to be facing the membrane 302. That is, the membrane 302 may be disposed between the plurality of back plates 305.

Therefore, as the sound wave is generated, vibration occurs at the membrane 302, and a distance between the membrane 302 and a lower back plate and a distance between the membrane and an upper back plate change according to the generated vibration.

In addition, the capacitance changes as the distance between the membrane 302 and the lower back plate and the distance between the membrane and the upper back plate change.

Meanwhile, the first sensor 120 may be implemented by a discharge method.

Figure 6:
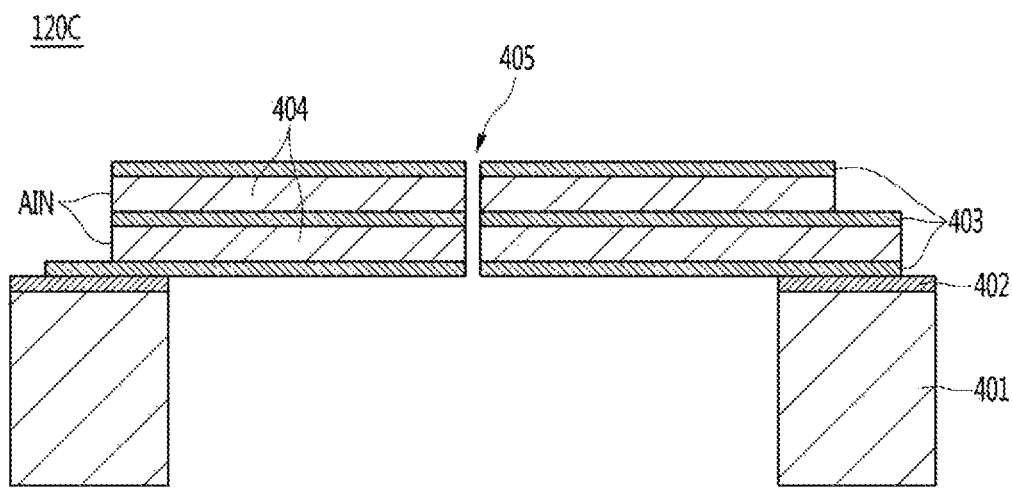

For this, referring to FIG. 6, the first sensor 120 may include a sensor body 401 and a diaphragm.

The diaphragm is formed in a plurality of layers on the sensor body 401, and is separated horizontally through an air inlet hole 405.

Reviewing this in detail, a silicon oxide layer 402 is disposed on the sensor body 401.

Further, a diaphragm is disposed on the silicon oxide layer 402, and the diaphragm includes a plurality of first electrode layers 403 and second electrode layers 404 disposed between the plurality of first electrode layers 403.

The plurality of first electrode layers 403 may include a first lower electrode layer, a first central electrode layer, and a first upper electrode layer. Furthermore, the plurality of first electrode layers 403 may be formed of molybdenum.

In addition, a plurality of second electrode layers 404 include a second lower electrode layer disposed between the first lower electrode layer and the first central electrode layer and a second upper electrode layer disposed between the first central electrode layer and the first upper electrode layer. Further, the plurality of second electrode layers 404 may be formed of aluminum nitride.

In the first sensor 120 having the above structure, air inlet holes 405 are formed in a plurality of layers constituting the diaphragm, and the air which has transmitted the sound wave passes through the air inlet holes 405.

Figure 7:
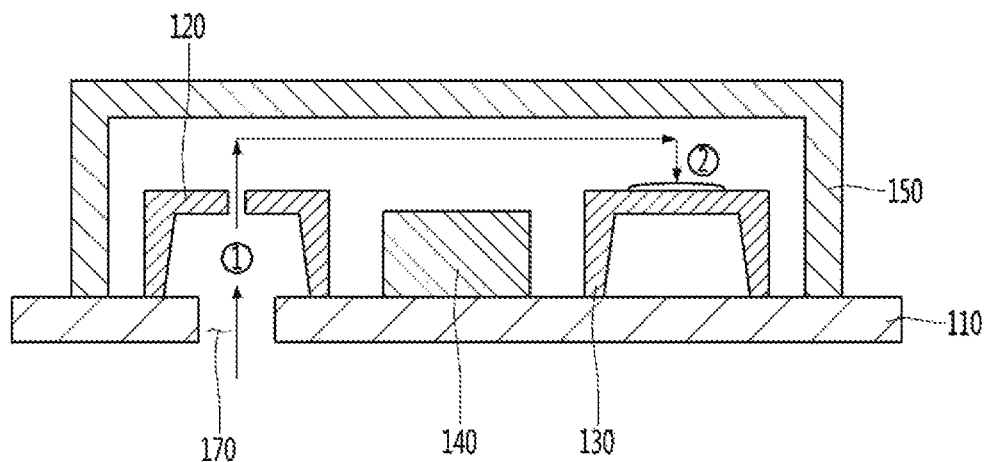
FIG. 7 is a view for explaining an operation principle of the composite sensor package according to the first embodiment of the present invention.

FIG. 7 is a view for explaining an operation principle of the composite sensor package according to the first embodiment of the present invention.

Referring to FIG. 7, the composite sensor package includes a cover 150 disposed on a substrate 110 to surround an upper region of the substrate 110, and a first sensor 120, a second sensor 130, and a signal processing device 140 are disposed in the upper region of the substrate surrounded by the cover 150, respectively.

Furthermore, a through hole 160 is formed at the substrate 110, and the user may generate a voice through the through hole 160.

When the voice is generated, a sound wave is transmitted via the air and is transmitted into a hollow portion of the first sensor 120 through the through hole 160, and the sound wave transmitted into the hollow portion stimulates the first sensor 120 to generate vibration. In addition, a primary sensing operation is performed through the first sensor 120 by the transmitted sound wave.

After the primary sensing operation is performed, the air that has transmitted the sound wave is introduced into the package accommodation space surrounded by the cover 150 through the air inlet hole formed at the first sensor 120.

Further, the passing air is transmitted to the second sensor 130 disposed in the package accommodation space, and the second sensor 130 performs a secondary sensing operation for the transmitted air.

That is, the second sensor 130 may be a gas sensor, and detects a gas included in the transmitted air.

As described above, in the present invention, the first sensor 120 and the second sensor 130 sense a signal by the air introduced through one through hole 160.

Figure 8:
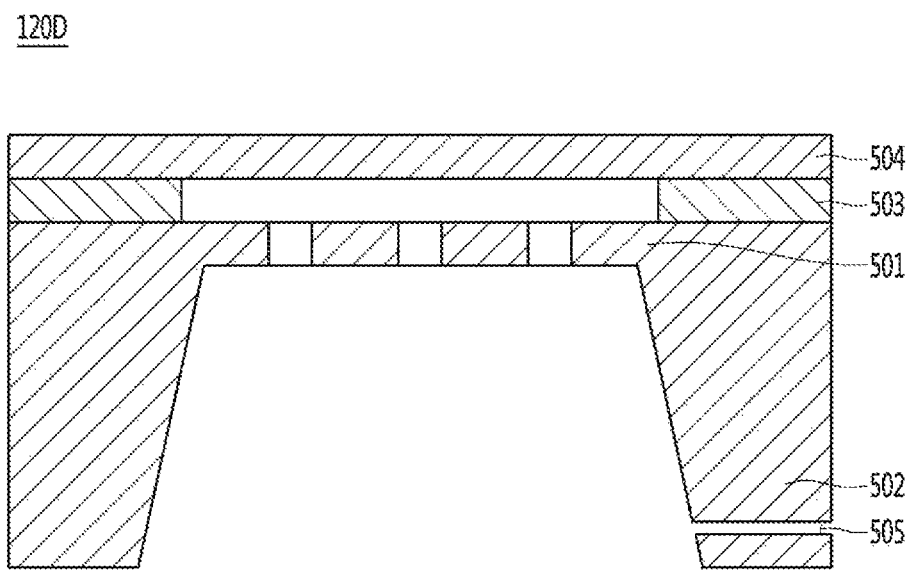
FIG. 8 is a view illustrating a first sensor 120 of a condenser type according to another embodiment of the present invention.

FIG. 8 is a view illustrating a first sensor 120 of a condenser type according to another embodiment of the present invention.

Referring to FIG. 8, the first sensor 120 has a structure in which a back plate 501 is disposed on a sensor body 502 using a MEMS technology, and a vibrating membrane 504 is disposed with a spacer 503 therebetween, respectively.

Since the structure of the first sensor 120 is already known in the art, a detailed description thereof will be omitted.

Meanwhile, the first sensor 120 of the condenser type has a structure in which a hole is not formed at the vibrating membrane 504 so that the air that has transmitted a sound wave to the package accommodation space may not pass therethrough and remain in a hollow portion of the sensor body 502.

Accordingly, in the present invention, the sensor body 502 is formed with an air passage hole 505 through which air can pass, and air staying in the hollow portion is introduced into the package accommodation space through the air passage hole 505.

At this point, when a sound wave is introduced from the outside by the air passage hole 505, the vibrating membrane 504 vibrates, so that external air may freely pass through the air passage hole 505, and an equilibrium state of the acoustic pressure fluctuation may be reached according to the passage of the vibrating membrane 504, and thus sensitivity and acoustic characteristics can be improved.

In addition, the air that has transmitted the sound wave is introduced into the package accommodation space through the air passage hole 505, so that a secondary sensing operation is performed by the second sensor 130.

Figure 9:
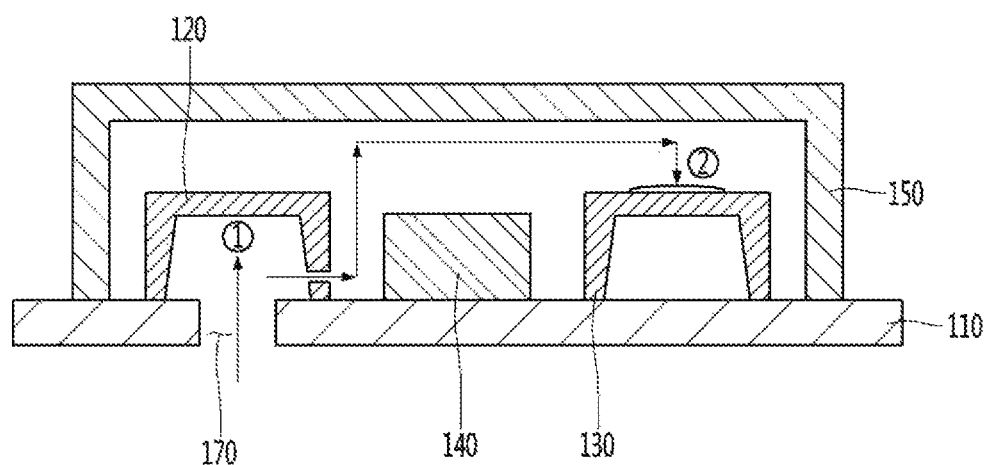
FIG. 9 is a view for explaining an operation principle of a composite sensor package according to a second embodiment of the present invention.

FIG. 9 is a view for explaining an operation principle of a composite sensor package according to a second embodiment of the present invention.

Referring to FIG. 9, the composite sensor package includes a cover 150 disposed on a substrate 110 to surround an upper region of the substrate 110, and a first sensor 120, a second sensor 130, and a signal processing device 140 are disposed in the upper region of the substrate surrounded by the cover 150, respectively.

Furthermore, a through hole 160 is formed at the substrate 110, and the user may generate a voice through the through hole 160.

When the voice is generated, a sound wave is transmitted via the air and is transmitted into a hollow portion of the first sensor 120 through the through hole 160, and the sound wave transmitted into the hollow portion stimulates the first sensor 120 to generate vibration. In addition, a primary sensing operation is performed through the first sensor 120 by the transmitted sound wave.

After the primary sensing operation is performed, the air that has transmitted the sound wave is introduced into the package accommodation space surrounded by the cover 150 through the air passage hole 505 formed at the sensor body 502 of the first sensor 120.

Further, the passing air is transmitted to the second sensor 130 disposed in the package accommodation space, and the second sensor 130 performs a secondary sensing operation for the transmitted air.

That is, the second sensor 130 may be a gas sensor, and detects a gas included in the transmitted air.

As described above, in the present invention, the first sensor 120 and the second sensor 130 sense a signal by the air introduced through one through hole 160 formed at a substrate.

Figure 10:
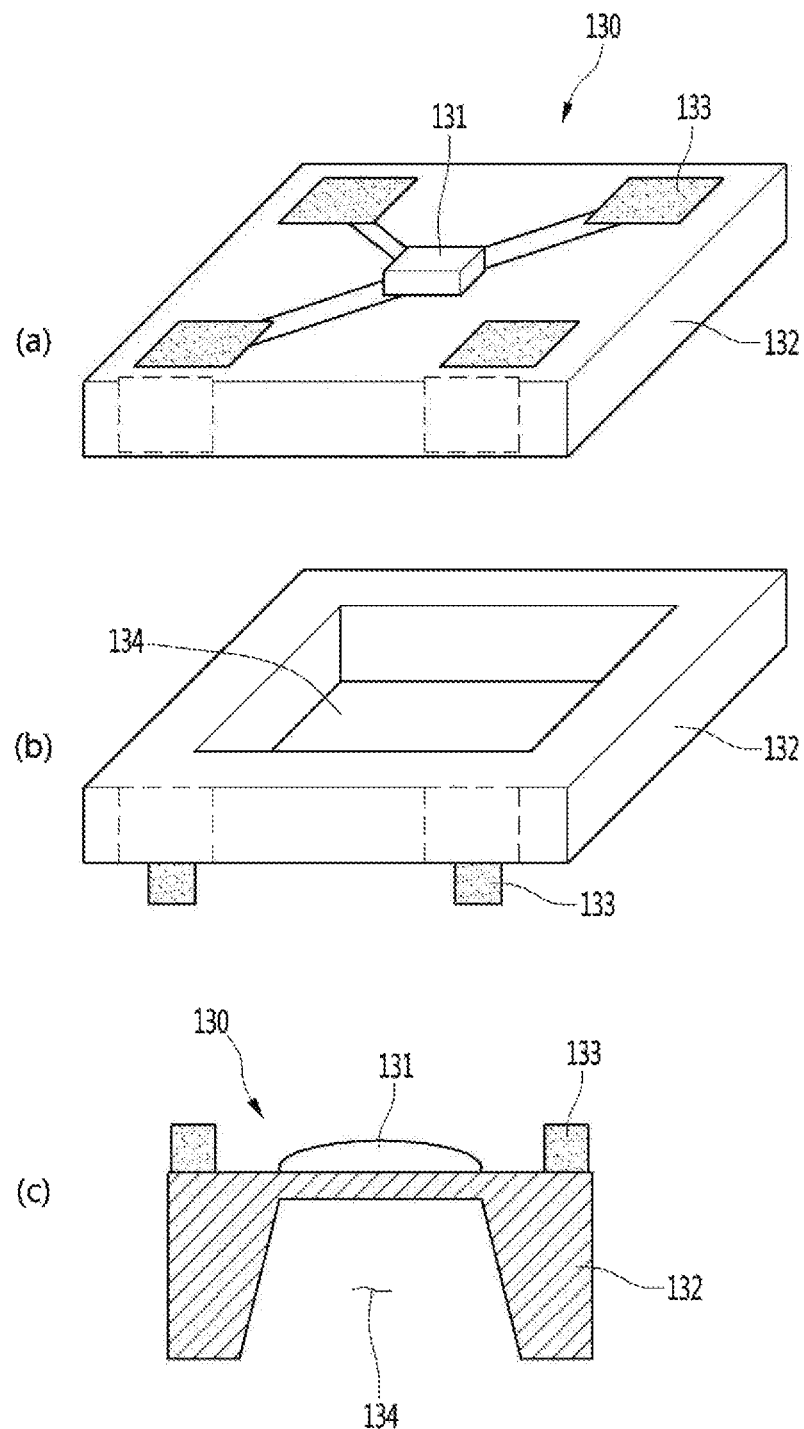
FIG. 10 is a view illustrating a detailed structure of a second sensor shown in FIG. 1.

FIG. 10 is a view illustrating a detailed structure of a second sensor shown in FIG. 1. Hereinafter, the second sensor 130 will be described as an example of a gas sensor.

Referring to FIG. 10, (a) is a perspective view of a gas sensor according to an embodiment of the present invention, in which a gas sensing part 131 for detecting a gas via a sensing material or a sensing chip may be disposed at a surface of a body 132, an electrode pattern 133 capable of connecting an external terminal to an adjacent surface may be provided, and the gas sensing part 131 and the electrode pattern 133 may be electrically connected to each other.

(b) of FIG. 10 illustrates a lower surface of the second sensor 130 shown in (a), and the lower surface of the second sensor 130 has a structure in which a predetermined cavity 134 is formed in the body 132, so that it is more preferable to be able to secure a gas staying time.

(c) of FIG. 10 illustrates a cross-sectional view of the second sensor 130. The second sensor 130, like the structure of FIG. 10 is mounted at a surface of the substrate 110 in FIG. 1 to detect a gas staying in the package accommodation space formed by the cover 150, in particular, the gas included in the air introduced through the first sensor 120.

[Package Structure According to a Second Embodiment]

Figure 11:
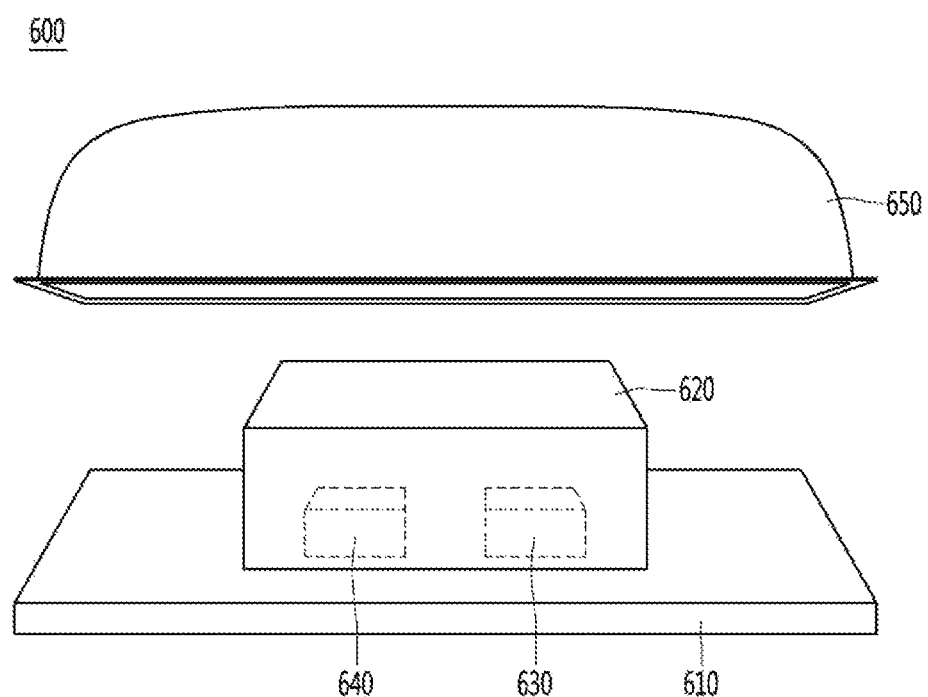
FIG. 11 is a view illustrating a structure of the composite sensor package according to the second embodiment of the present invention.
Figure 12:
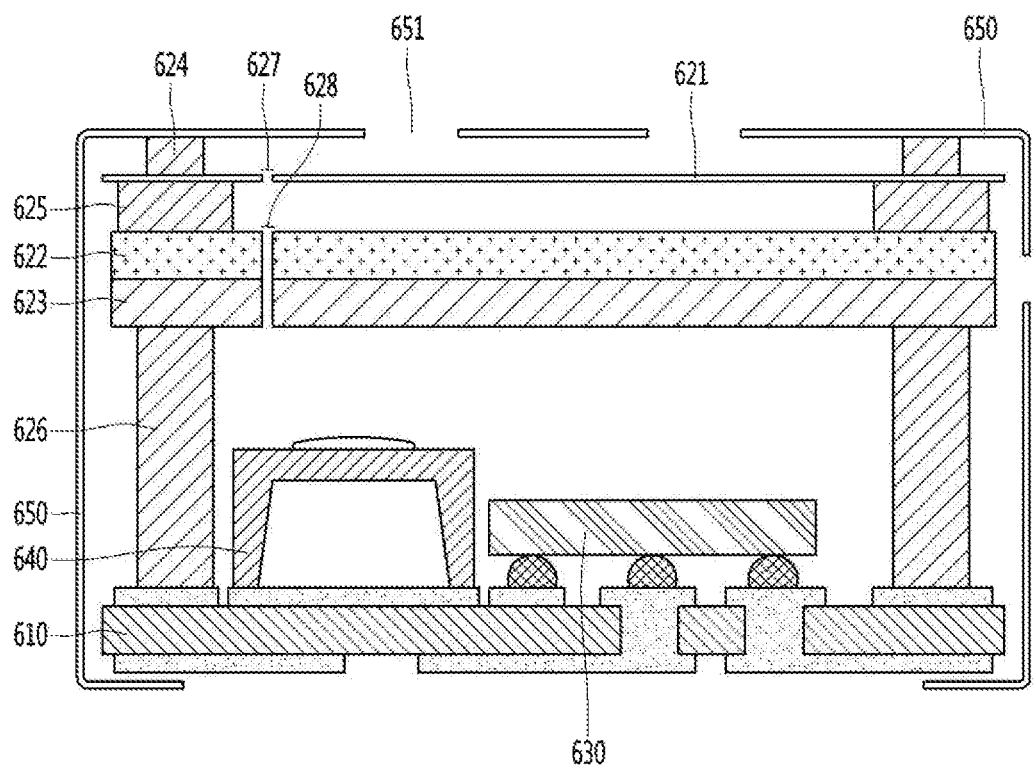
FIG. 12 is a cross-sectional view illustrating a detailed structure of the composite sensor package shown in FIG. 11.

FIG. 11 is a view illustrating a structure of a composite sensor package according to a second embodiment of the present invention, and FIG. 12 is a cross-sectional view illustrating a detailed structure of the composite sensor package shown in FIG. 11.

Referring to FIG. 11, the composite sensor package includes a substrate 610, a first sensor 620 disposed on the substrate 610, a case 650 disposed on the substrate 610 to surround the first sensor 640, and a signal processing device 630 and a second sensor 640 disposed in the accommodating space inside the first sensor.

Further, referring to FIG. 12, a detailed structure of the composite sensor package includes a case 650, diaphragms 621 and 624, back electrode plates 622 and 623, and a substrate 610, and the diaphragms 621 and 624 and the back electrode plates 622 and 623 are housed in an insulating housing formed by the case 650 so as to maintain a mutually electrically insulating relationship.

The substrate 610 is a support substrate of a composite sensor package in which a single pattern is formed. At this point, the substrate 610 may refer to one insulating layer on which any one circuit pattern of the substrate having a plurality of laminated structures is formed.

The substrate 610 forms an insulating plate, and may be a thermosetting or thermoplastic polymer substrate, a ceramic substrate, an organic-inorganic composite material substrate, or a glass fiber-impregnated substrate. The substrate 610 may include an epoxy-based insulating resin such as FR-4, bismaleimide triazine (BT), and Ajinomoto build-up film (ABF) when including a polymer resin, or also include a polyimide-based resin unlike the above, but is not particularly limited thereto.

A circuit pattern is formed on the substrate 610. The circuit pattern may be formed by a general process of manufacturing a PCB, such as an additive process, a subtractive process, an MSAP, a SAP, etc., and detailed descriptions thereof will be omitted herein.

Meanwhile, the circuit pattern may include a plurality of patterns disposed to be spaced apart on the substrate at a predetermined distance. The circuit pattern may generally include at least one of a surface treatment plated layer of, silver, gold, and tin to copper.

A via hole is formed at the substrate 610, so that circuit patterns formed on upper and lower surfaces of the substrate 610 may be electrically connected to each other.

Meanwhile, the via hole may be formed by any one of mechanical, laser, and chemical processing.

When the via hole is formed by mechanical processing, a method such as milling, drilling and routing may be used. When the via hole 125 is formed by laser processing, a method of UV or $CO_2$ laser can be used. And when the via hole is formed by chemical processing, the substrate 610 may be opened by using a chemical including aminosilane, ketones, or the like.

Meanwhile, the laser processing is a cutting method in which a part of a material is melted and evaporated by concentrating optical energy on a surface to take a desired shape. Complex formation by a computer program can be easily processed, and composite materials that are difficult to cut by other methods can be processed.

In addition, the processing by the laser can have a cutting diameter of at least 0.005 mm, and has a wide range of thickness that can be processed.

As the laser processing drill, yttrium aluminum garnet (YAG) laser, $CO_2$ laser or ultraviolet (UV) laser is preferably used. The YAG laser is a laser capable of processing both a copper foil layer and an insulating layer, and the $CO_2$ laser is a laser capable of processing only an insulating layer.

The via hole is filled with a metal material to form a via so that at least one of the circuit patterns formed on the lower surface of the substrate 610 may function as an output pad for transmitting a signal of the composite sensor package to the outside and the other may function as an input pad for transmitting a signal transmitted from the outside to a device in the composite sensor package.

The case 650 is formed to surround the upper region of the substrate and may be made of a conductive material such as nickel, copper, aluminum, and copper, or an alloy thereof. Further, a through hole 651 is formed at the case 650 so that the air including a sound wave may be introduced from the outside.

The diaphragms 621 and 624 are vibrated by external stimulation transmitted through the through hole 651 of the case 650, that is, a sound wave by a voice signal so that a single polarity of a capacitor that generates a change in electric field may be formed.

The diaphragms 621 and 624 are made of a diaphragm made of a polymer film having an electric field phenomenon in which electric charges remain even after removing the electric field when a strong electric field is applied. The diaphragms 621 and 624, which are polymer compounds, always have electric charges, so that an external DC voltage like an electrostatic type is not necessary.

The diaphragms 621 and 624 are composed of a polarity ring 624 and a vibrating membrane 621 in detail. The polarity ring 624 is used to separate and maintain a gap between the vibrating membrane 621 and an inner surface of the case 650, and the vibrating membrane 621 is in contact with one surface thereof. The polarity ring 624 is formed in the form of a donut or ring by using a metal such as copper and an alloy thereof and serves as a conductor for electrically connecting the substrate 610 and the vibrating membrane 621 via the case 650. The vibrating membrane 621 is made of a film of insulating material such as polyethylene terephthalate (PET) of a thickness of several micrometers and serves to change an electric field by the vibration caused by an acoustic pressure.

In the back electrode plates 622 and 623, the capacitance changes due to a change in the vibration transmitted from the diaphragms 621 and 624, that is, separation displacement between the vibrating membrane 621 and the back electrode plates 622 and 623 serve to convert a voice signal into an electric signal by using the principle that the accumulated electric charges of the back electrode plates 622 and 623 change depending on the change of the capacitance. That is, an original voice signal is converted into an electric signal by using different currents flowing depending on a change in sound.

The back electrode plates 622 and 623 are constructed such that an electret film 622 to be injected with an electric charge is adhered to one surface of a metal plate 623 facing the diaphragms 621 and 624, and the electret film 622 faces the diaphragms 621 and 624 via a spacer ring 625, which is an insulator, as a medium at a predetermined distance, and forms a capacitor region for forming an electric field therebetween. The electret film 622 is thermally fused and fixed to one surface of the back electrode plates 622 and 623 facing the diaphragms 621 and 624 through laminating, and the other polarity of the capacitor facing the diaphragm is formed by injecting the electric charge using an electric charge injector.

The electret film 622 is preferably made of one selected from a polymer film such as fluorinated ethylene propylene (FEP), polytetrafluoroethylene (PTFE), perfluoroalkoxy (PFA), or the like, and it is preferable that the metal plate 623, in which an electret film is attached to one surface thereof, is made of at least one of gold, bronze, brass and phosphor bronze. In addition, a height of the spacer ring separating the back electrode plate from the diaphragm may be selectively applied within a range of 0.01 to 0.04 mm.

Meanwhile, a connection part 626 is disposed on the substrate 610.

One end of the connection part 626 is connected to a circuit pattern formed on the substrate 610 and the other end is connected to a lower surface of the metal plate 623.

At this point, the connection part 626 is formed with a predetermined height, and spaces apart between the back electrode plate and the substrate at a predetermined distance, and accordingly, an accommodating space capable of receiving the second sensor and the signal processing device on the substrate may be formed.

Meanwhile, a second sensor 640 and a signal processing device 630 are disposed on the substrate 610.

The signal processing device 630 may include a field effect transistor (FET) for amplifying and outputting an electric signal to refine a transmitted electric signal and transmit the electric signal to an external device, and an multilayer ceramic capacitor (MLCC) for filtering a signal output from the FET, and a circuit pattern is formed on the substrate 610 to provide electrical passages thereof.

The vibrating membrane 621 is formed with a first air passage hole 627 for passing air therethrough and a second air passage hole 628 is formed at the electret film 622 and the metal plate 623 at positions corresponding to the first air passage holes 627.

The first air passage hole 627 and the second air passage hole 628 pass the air that has transmitted the sound wave detected by the diaphragm and the back plate, and accordingly, transmit to the second sensor 640 disposed in the accommodating space.

In addition, the second sensor 640 is disposed in the first sensor and detects a state of the air by receiving the air that has transmitted the sound wave introduced into the first sensor. The state of the air may include a state of a gas included in the air.

As described above, according to the second embodiment of the present invention, a first sensor constituting a microphone sensor is disposed on a substrate, and a case is formed while surrounding the substrate and the first sensor.

Further, a through hole is formed at the case to transmit a sound wave to the first sensor.

Meanwhile, a signal processing device and a second sensor are disposed in an accommodating space inside the first sensor.

Furthermore, the first sensor detects the sound wave, and simultaneously, passes the air that has transmitted the sound wave through an internal air passage hole to transmit to the second sensor disposed in the accommodating space.

In addition, the second sensor detects a state of the air passing the first sensor, which may be in a gas state.

Figure 13:
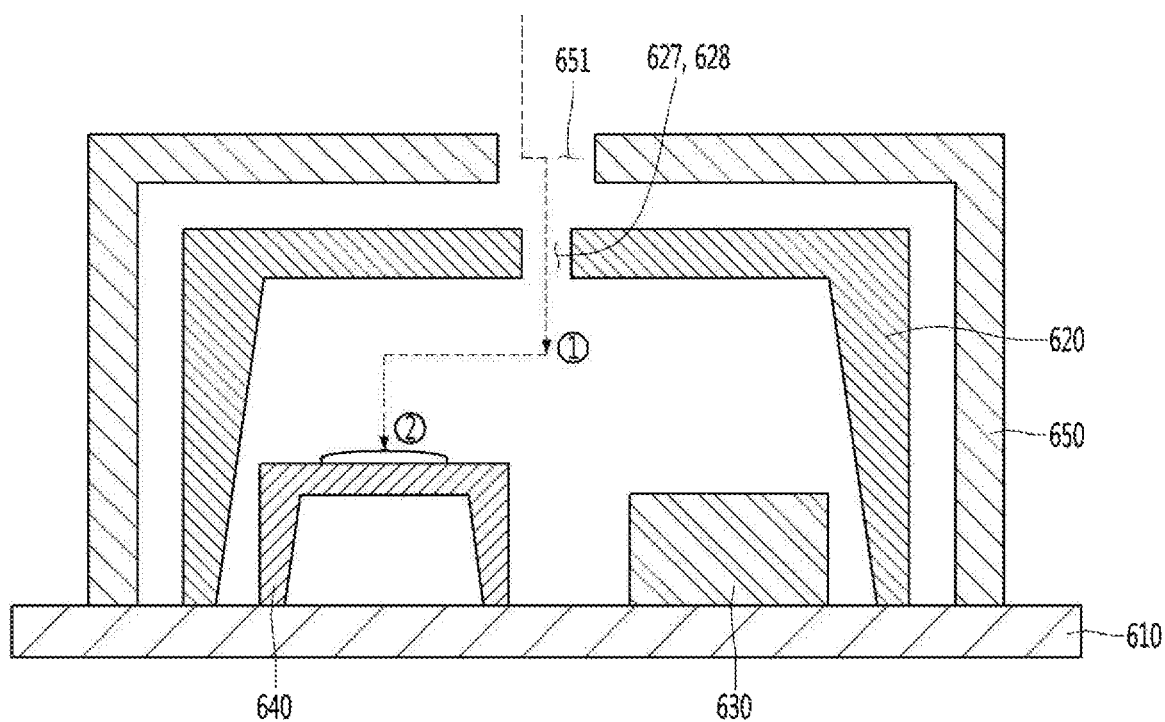
FIG. 13 is a view for explaining an operation principle of the composite sensor package shown in FIGS. 11 and 12.

FIG. 13 is a view for explaining an operation principle of the composite sensor package shown in FIGS. 11 and 12.

Referring to FIG. 13, in the composite sensor package, a case 650 is disposed on a substrate 610 to surround an upper region of the substrate 610, and a first sensor 620 is disposed at the upper region of the substrate surrounded by the case 650.

Further, a second sensor 640 and a signal processing device 630 are disposed in an accommodating space inside the first sensor 620, respectively.

Further, a through hole 651 is formed at the case 650, and the user may generate a voice through the through hole 651.

When the voice is generated, a sound wave is transmitted via the air and is transmitted to the first sensor 620 through the through hole 651, and a primary sensing operation is performed through the first sensor 620.

After the primary sensing operation is performed, the air that has transmitted the sound wave is introduced into the accommodating space inside the first sensor 620.

Furthermore, the air that has transmitted the sound wave is transmitted to the second sensor 640 disposed inside the first sensor 620 and the second sensor 640 performs a secondary sensing operation for the transmitted air.

That is, the second sensor 640 may be a gas sensor, and detects a gas included in the transmitted air.

According to an embodiment of the present invention, an integrated package is configured by integrating a microphone sensor and an environmental sensor having the same requirement for a configuration of a package, thereby improving performance while reducing a size or cost of a sensor.

In addition, according to an embodiment of the present invention, by forming only one inlet hole through which external air may flow into a composite sensor package, it is possible to reduce malfunction of a sensor due to the introducing of dust, moisture or the like, which is generated as the inlet hole increases.

Further, according to an embodiment of the present invention, as voice recognition is performed via the microphone sensor by configuring a microphone sensor and a gas sensor as an integrated package, it is possible to easily check health information of a user who has performed the voice recognition.

Further, according to an embodiment of the present invention, by allowing the same air to flow into a microphone sensor and a gas sensor, it is possible to make a voice signal (air) of only a user used in the voice recognition flow into the gas sensor, so that a more accurate check of health condition can be performed, thereby improving user satisfaction.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modification are included in the scope of the present invention.

Embodiments are mostly described above. However, they are only examples and do not limit the present invention. A person skilled in the art may appreciate that several variations and applications not presented above may be made without departing from the essential characteristics of the embodiments. For example, each component particularly represented in the embodiments may be varied. In addition, it should be construed that differences related to such a variation and such an application are included in the scope of the present invention defined in the following claims.

The invention claimed is:

1. A composite sensor package comprising:
   a substrate;
   a first sensor and a second sensor disposed on the substrate at a predetermined distance therebetween;
   a signal processing device disposed on the substrate and processing a signal transmitted via the first and second sensors; and
   a cover disposed on the substrate and including a package accommodation space surrounding the first sensor, the second sensor and the signal processing device, wherein the first sensor senses a state of air introduced from an outside and transmits the introduced air to the package accommodation space, and the second sensor senses a state of the air passing the first sensor and introduced into the package accommodation space.

2. The composite sensor package of claim 1, wherein the substrate includes a through hole formed at a region in which the first sensor is disposed and transmitting a sound wave to the first sensor.

3. The composite sensor package of claim 2, wherein the first sensor detects a sound wave introduced through the through hole, and passes air that has transmitted the introduced sound wave and transmits the air to the package accommodation space.

4. The composite sensor package of claim 2, wherein the first sensor is a microphone sensor, and the second sensor includes at least one of a temperature sensor, a humidity sensor, a pressure sensor, and a gas sensor for sensing a state of air that has transmitted the sound wave.

5. The composite sensor package of claim 2, wherein the first sensor includes a sensor body disposed on the substrate and having a hollow portion formed at a region corresponding to the through hole, a vibrating membrane covering the hollow portion and disposed on the sensor body and having a first air passage hole formed therein, and a back plate supported by the sensor body and disposed on the vibrating membrane and having a second air passage hole formed therein.

6. The composite sensor package of claim 5, wherein the first sensor outputs a signal corresponding to a change in the distance between the vibrating membrane and the back plate due to vibration generated by the sound wave, and transmits air that has transmitted the sound wave through the first air passage hole and the second air passage hole to the package accommodation space.

7. The composite sensor package of claim 2, wherein the first sensor includes a sensor body disposed on the substrate and having a hollow portion formed at a region corresponding to the through hole, a back plate covering the hollow portion and disposed on the sensor body and having an air passage hole formed therein, and a membrane supported by a spring by the sensor body and disposed on the back plate.

8. The composite sensor package of claim 7, wherein the back plate is disposed at an upper portion and a lower portion of the membrane, respectively, with the membrane therebetween.

9. The composite sensor package of claim 7, wherein the first sensor outputs a signal corresponding to a change in the distance between the membrane and the back plate due to vibration generated by the sound wave, and transmits air that has transmitted the sound wave through the air passage hole and the spring to the package accommodation space.

10. The composite sensor package of claim 2, wherein the first sensor includes a sensor body disposed on the substrate and having a hollow portion formed at a region corresponding to the through hole, a first metal layer disposed on the sensor body and including molybdenum, and a second metal layer disposed between the plurality of first metal layers and including aluminum nitride, and an air passage hole is formed at the first metal layer and the second metal layer to pass air that has transmitted the sound wave.

11. The composite sensor package of claim 2, wherein the first sensor includes a sensor body disposed on the substrate and having a hollow portion formed at a region corresponding to the through hole, a back plate disposed on the sensor body, and a vibrating membrane disposed on the back plate, with a spacer therebetween, and an air passage hole is formed at a lower portion of the sensor body to transmit air that has transmitted the sound wave to the package accommodation space.

12. The composite sensor package of claim 1, wherein the second sensor includes a body disposed on the substrate, and a sensing part disposed on a surface of the body and detecting a state of the air passing the first sensor and diffused into the package accommodation space.

13. A composite sensor package comprising:
a substrate;
a case covering an upper region of the substrate and including a first accommodation space therein;
a first sensor disposed in the first accommodation space on the substrate and including a second accommodation space therein; and
a second sensor disposed in an accommodating space of the first sensor,
wherein the second sensor is disposed in the first sensor and senses a state of air passing the first sensor and introduced into the second accommodation space.

14. The composite sensor package of claim 13, wherein the case includes a through hole formed at a region in which the first sensor is disposed and transmitting a sound wave to the first sensor.

15. The composite sensor package of claim 14, wherein the first sensor detects a sound wave introduced through the through hole, and passes air that has transmitted the introduced sound wave and transmits the air to the second accommodation space therein.

16. The composite sensor package of claim 14, wherein the first sensor is a microphone sensor, and the second sensor includes at least one of a temperature sensor, a humidity sensor, a pressure sensor, and a gas sensor for sensing a state of air that has transmitted the sound wave.

17. The composite sensor package of claim 14, further comprising:
a signal processing device which is disposed in the second accommodation space for processing output signals of the first sensor and the second sensor.

18. The composite sensor package of claim 17, further comprising,
a signal input/output pad which is disposed on a lower surface of the substrate and electrically connected to the signal processing device.

19. The composite sensor package of claim 14, wherein the first sensor includes a diaphragm vibrated by a sound wave transmitted through the through hole to generate a change in electric field, a back electrode plate disposed under the diaphragm and in which stored electric charges change due to a change in vibration transmitted from the diaphragm, and a connection part disposed between the back electrode plate and the substrate and spacing apart between the back electrode plate and the substrate to form the second accommodating space.

20. The composite sensor package of claim 19, wherein a first air passage hole is formed at the first diaphragm, a second air passage hole is formed at the second diaphragm, and the air that has transmitted the sound wave through the first and second air passage holes is transmitted into the second accommodation space.

* * * * *